United States Patent [19]
Bremer et al.

[11] Patent Number: 4,577,101
[45] Date of Patent: Mar. 18, 1986

[54] SHAFT ENCODER WITH AN OPTICAL SYSTEM COMPRISING TWO STRAIGHT-LINE-GENERATRIX SURFACES

[75] Inventors: Joannes G. Bremer, Eindhoven; Klaas Compaan, Geldrop, both of Netherlands

[73] Assignee: U.S. Philips Corporation, New York, N.Y.

[21] Appl. No.: 502,079

[22] Filed: Jun. 8, 1983

[30] Foreign Application Priority Data

Jun. 8, 1982 [NL] Netherlands ............... 8202300

[51] Int. Cl.$^4$ .............................................. G01D 5/34
[52] U.S. Cl. ........................... 250/231 SE; 340/347 P
[58] Field of Search ........ 250/231 SE, 237 G, 231 R, 250/209; 356/373, 374, 375; 340/347 P

[56] References Cited

U.S. PATENT DOCUMENTS

| 3,973,119 | 8/1976 | Renes et al. | 250/231 R |
| 3,985,448 | 10/1976 | Wilkund et al. | 250/231 SE |
| 4,143,268 | 3/1979 | Marold et al. | 250/237 G |
| 4,247,769 | 1/1981 | Warner | 250/237 G |

FOREIGN PATENT DOCUMENTS 0641484 1/1979 U.S.S.R. ............... 340/347 P

Primary Examiner—Edward P. Westin
Attorney, Agent, or Firm—David R. Treacy

[57] ABSTRACT

An optical measuring system for determining angular displacements of an object, including a radial grating connected to the object. Optical elements including two straight-line-generatrix surfaces focus the grating image as a parallel grating image onto a linear array radiation-sensitive detection system. The linear array may be photodiodes functioning as a grating-like element.

15 Claims, 14 Drawing Figures

4,577,101

SHAFT ENCODER WITH AN OPTICAL SYSTEM COMPRISING TWO STRAIGHT-LINE-GENERATRIX SURFACES

BACKGROUND OF THE INVENTION

The invention relates to apparatus for determining the angular displacement of an object by means of a measurement grating which is mechanically connected to the object; and more particularly to such an apparatus which comprises a radiation source for illuminating the measurement grating and a radiation-sensitive detection system comprising a grating-like element.

U.S. Pat. No. 3,973,119 describes such apparatus in which the detection system is a multiple photo cell comprising an array of line-shaped photo-diodes, which are sequentially connected to an electronic circuit by means of an electrical switch. The electronic circuit then processes the signal generated in the photo-diodes. As described in this patent the displacement of an object, for example a part of a tool, can be measured by projecting an image of a first grating which is connected to the object onto a reference grating formed by a multiple photo-cell. The operation of the electrical switch causes an apparent movement of the reference grating over the surface of the multiple photocell. This permits dynamic detection which is substantially independent of environmental conditions, moreover, the direction of the displacement can be determined. The dynamic detection is effected without the use of a separate reference grating and of moving parts for imparting a uniform motion to this grating, so that the displacement transducer is of simple construction and is highly insensitive to vibration. In practice it has been found that the apparatus described in U.S. Pat. No. 3,973,119 is very reliable and accurate.

The line-shaped photo-diodes and the intermediate strips of the multiple photo-cell constitute a grating with parallel grating lines, hereinafter referred to as a "parallel grating". Such a grating is suitable for measuring linear displacements only. For measuring angular displacements of an object, this object would have to be coupled mechanically to a circular disk provided with a grating with radial grating lines, hereinafter referred to as a "radial grating". When a radial grating is imaged onto the multiple photo-cell one line of the radial grating may cover a plurality of photo-diodes, while at the same time parts of the photo-diodes are not illuminated. Therefore, the movement of such a radial grating cannot be measured with suitable accuracy by means of a linear grating.

SUMMARY OF THE INVENTION

It is an object of the present invention to modify the apparatus described above in such a way that it becomes more versatile.

According to the invention, in an apparatus for determining angular displacements of an object, the measurement grating comprises radially extending grating strips on a circular disk, and an optical system comprising two straight-line-generatrix anamorphic surfaces is arranged between the measurement grating and the radiation-sensitive detection system.

The two straight-line-generatrix surfaces ensure that the radial grating is imaged onto the multiple photo-cell as a linear grating. Herein, a straight-line-generatrix surface is to be understood to mean a surface generated by a specific motion of a straight line (the generatrix). Such a straight-line-generatrix surface is for example a cylinder or a hyperboloid or a cone.

The apparatus may be constructed in different manners, depending on whether a reflection grating or a transmission grating is used and depending on the position of the multiple photo-cell relative to the circular disk.

A first set of preferred embodiments of the invention is further characterized in that the two straight-line-generating surfaces comprise a radiation-refracting surface and a radiation-reflecting surface. Preferably, the radiation-refracting surface is a cylindrical lens and the radiation-reflecting surface a conical reflector.

A second set of embodiments of the invention is characterized in that the two straight-line-generatrix surfaces are radiation-reflecting surfaces.

Alternatively, the two straight-line-generatrix surfaces may be radiation-refracting surfaces.

preferably, the two straight-line-generatrix surfaces form one constructional unit.

The invention will now be described in more detail, by way of example, with reference to the drawings.

DESCRIPTION OF THE PREFERRED EMBODIMENTS

Figure 1A:
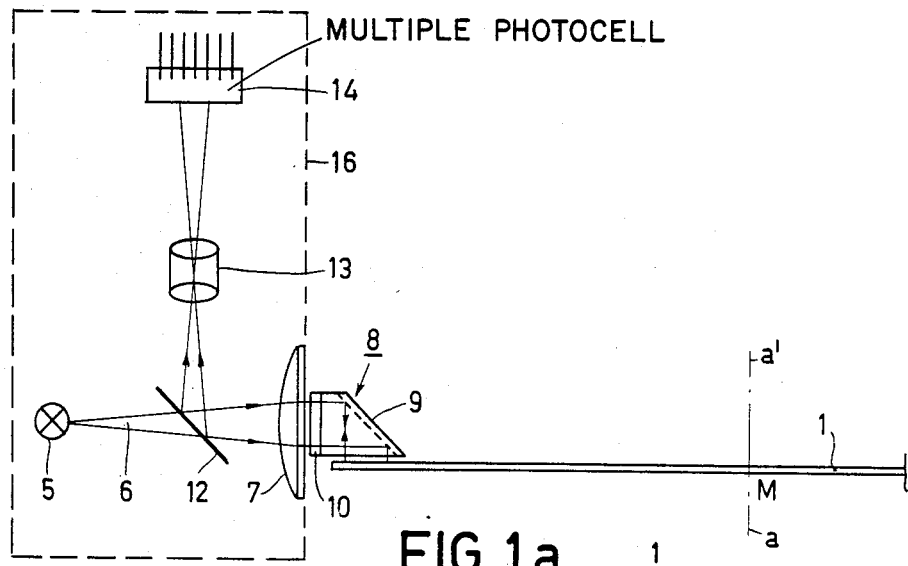
FIGS. 1a and 1b are a side view and a plan view respectively of a first embodiment of the invention.
Figure 1B:
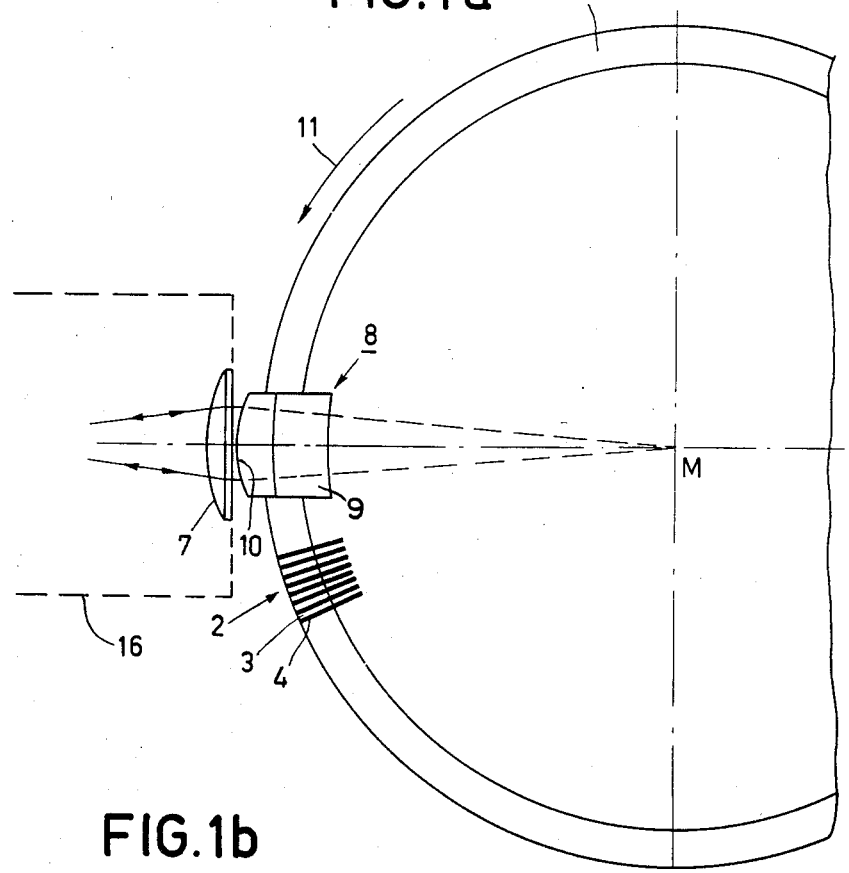

FIG. 1a and FIG. 1b show a circular disk 1 with a center M, connected to an object, not shown, whose rotation is to be measured. On this disk a measuring grating 2 is arranged. This grating comprises a plurality of equidistant radial reflecting strips 3 which alternate with radiation-absorbing strips 4. This radial grating is illuminated by a beam 6 from a radiation source 5, for example a light-emitting diode (LED). The source 5 is arranged in the focal plane of a field lens 7 which collimates the beam 6. A compound element 8 which includes an reflecting element 9 reflects the beam which emerges from the field lens to the measurement grating 2. The radiation reflected by this grating is projected onto the multiple photo-cell 14 via the element 9, the field lens 7, a semi-transparent mirror 12 and an objective 13.

Figure 2:
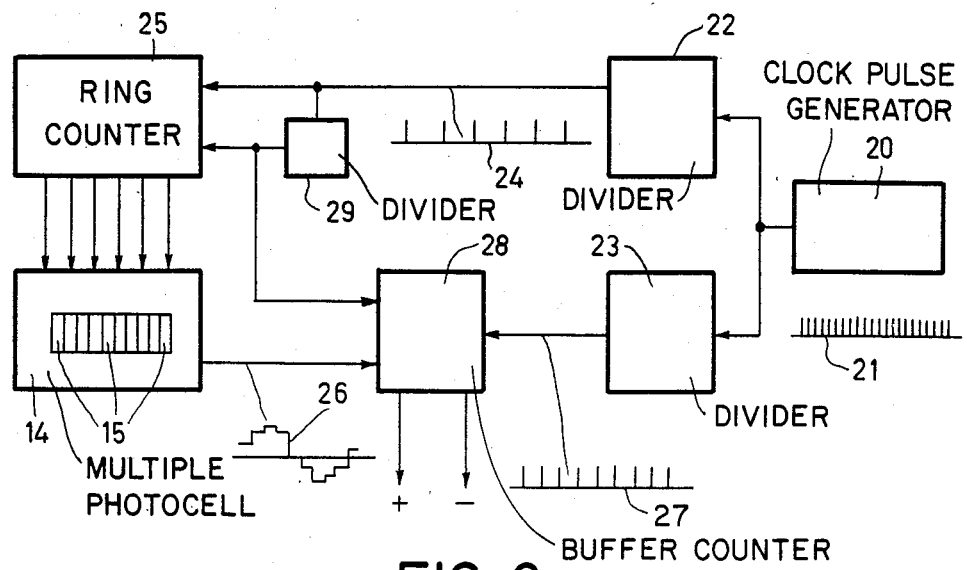
FIG. 2 is a block diagram of a circuit used in the apparatus.

FIG. 2 is a front view of the multiple photo-cell 14 and also shows a block diagram of the signal-processing circuit. The photo-cell 14 comprises a large number of photo-sensitive elements, such as photo-diodes 15, arranged in a comparatively small number of groups. Each group comprises a comparatively large number of photo-diodes. The number of photo-diodes per period of the projected measurement grating 2 should be as large as possible for optimum electrical reproduction of the optical signal. On the other hand the scanned part of the measurement grating 2, which for example comprises 720 grating periods over its entire circumference, should also be as large as possible.

In one version of the multiple photo-cell the number of photo-diodes was 220 and the length of each photo-diode was 1.8 mm. The width of each photo-diode was 10 μm and the spacing of the photo-diodes was also 10 μm. The number of photo-diodes per period of the measurement grating 2 was 10, so that the field of view covered 22 grating periods. Corresponding photo-diodes of each set of 10 consecutive photo-diodes were interconnected, yielding 10 sets of 22 photo-diodes each.

A stationary grating with a black-white ratio of 1:1 in the surface of the multiple photo-cell 14 is simulated by activating five consecutive groups of photodiodes. A travelling grating is obtained when the activation of the set of five groups is repeatedly advanced by one group.

In the processing circuit, whose block diagram is shown in FIG. 2, clock pulses which are generated in the clock-pulse generator 20 are applied to a divider 22 and a divider 23. The divider 22 supplies pulses 24, which control a ring counter 25. The multiple photo-cell 14 is activated by the ring counter 25 and produces the measurement signal 26. The divider 23 supplies pulses 27 which are generally of a different repetition rate than the control pulses 24 from the divider 22 and which form the reference signal. In the buffer counter 28 the measurement signal 26 and the reference pulses 27 are compared with each other. The output pulses of the buffer counter 28 are, for example, applied to an indicator.

The ring counter 25 activates consecutive groups of photo-diodes of the multiple photo-cell 14, so that a grating apparently travels over the surface of the photo-cell 14 with constant velocity. The period of this grating is equal to that of the projection of the measurement grating 2 on the photo-cell 14. When the grating 2 is stationary relative to the photo-cell 14 the measurement signal has a constant frequency. If the projection of the measurement grating moves in the same direction as the apparent grating which is activated by the ring counter 25, the frequency of the measurement signal 26 decreases, while in the case of movement in the opposite direction the frequency of the measurement signal 26 increases. Thus, it is possible to determine the direction and magnitude of the displacement of the measurement grating 2 and consequently of the displacement of the object.

Within a range of one period of the measurement grating 2 the position of the multiple photo-cell 14 relative to the grating 2 can be determined in an absolute manner by measuring the phase difference between the measurement signal 26 and the reset signal of the ring counter 25. The ring counter 25 should be reset at each start of measurements in order to guarantee that the counter starts counting from a well-defined initial position.

However, the circuit becomes simpler and more reliable if the ring counter 25 is reset after each period. The reset signal is produced by dividing the pulses 24 in the divider 29. The frequency of the reset pulse is selected to equal the nominal frequency of the measurement signal 26.

According to the invention optical elements are selected and arranged in the radiation path, between the measurement grating 2 and the field lens 7, to ensure that the radial measurement grating 2 is imaged onto the multiple photo-cell 14 as a parallel grating. These elements, as is shown in FIGS. 1a, 1b, 7a and 7b, may comprise a cylindrical lens 10 and a conical reflector 9. The operation of these elements will be explained by following the path taken by the radiation beam 6 emitted by the source 5.

After beam 6 has been converted into a parallel beam by the field lens 7 it reaches the cylindrical lens 10. This lens, which has a converging action only in the plane of drawing of FIG. 1b, ensures that rays originally in a plane parallel to the axis aa' of the disk 1 are deflected into a plane passing through the axis aa', as indicated by the dashed line in FIG. 1b. Subsequently the beam impinges on the reflecting conical surface 9, whose cone axis coincides with the disk axis aa'. Rays deflected by the lens 10 into a particular plane through the disk axis aa' are reflected in the same plane by the conical surface 9. In the example shown the apex half angle of the cone is 45°, so that the rays are reflected through an angle of 90° and are perpendicularly incident on the disk 1. These rays together form a line which coincides with a strip of the measurement grating 2. In a similar way rays situated in other planes through the disk axis aa' are aimed at other strips of the measurement grating. Thus, a segment of the angular grating, which segment has, for example, a length of 15 mm and a width of 5 mm, is illuminated. The radiation beam reflected by the measurement grating traverses the same path through the conical reflector 9 and the cylindrical lens 10 in the reverse direction. These straight-line-generatrix elements ensure that the radial grating is imaged onto the multiple photo-cell 14 as a parallel grating via the field lens 7, the semitransparent mirror 12 and the objective 13.

The conical reflector 9 and the cylindrical lens 10 are suitably constructed as an integrated element 8, so that these elements need not be aligned separately relative to the other elements of the device. The element 8 may be connected mechanically to a housing 16 which accommodates the source 5, the mirror 12, the field lens 7, the objective 13 and the photo-cell 14.

In a practical embodiment of the apparatus shown in FIG. 1a and 1b, using a measurement grating having 720 grating periods, angular displacements could be measured with a resolution of approximately 1 arcsec.

Figure 4:
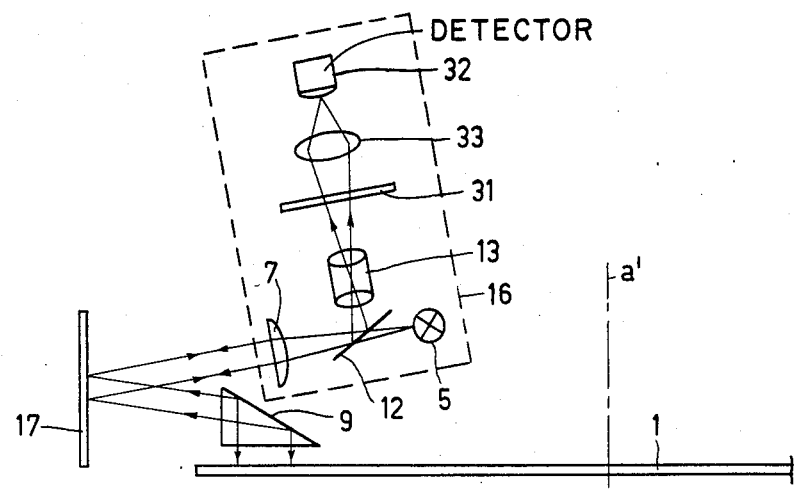
Figure 5:
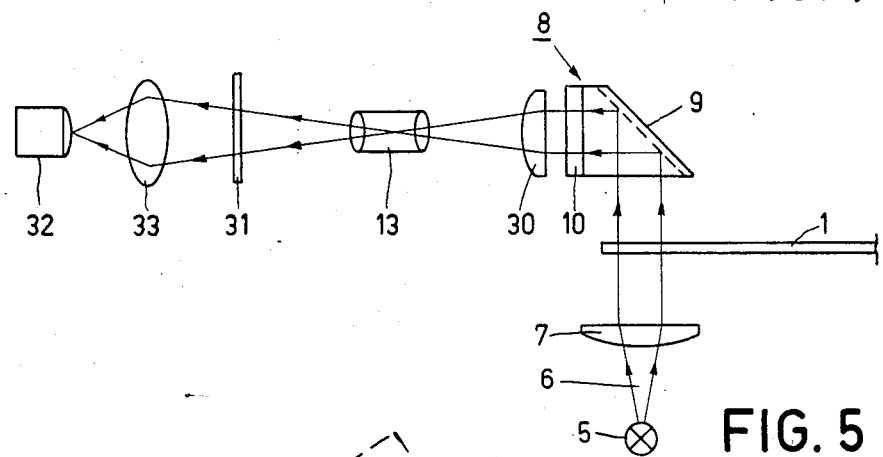

It is to be noted that the invention is not limited to the use of a multiple photo-cell as the radiation sensitive detection system. As is shown in FIGS. 4 and 5, the detection system may alternatively comprise a parallel grating 31, behind which a single detector 32 is arranged. If required, a further lens 33 may be arranged between the grating and the detector in order to concentrate a maximum amount of radiation traversing the gratng onto the detector.

Figure 3:
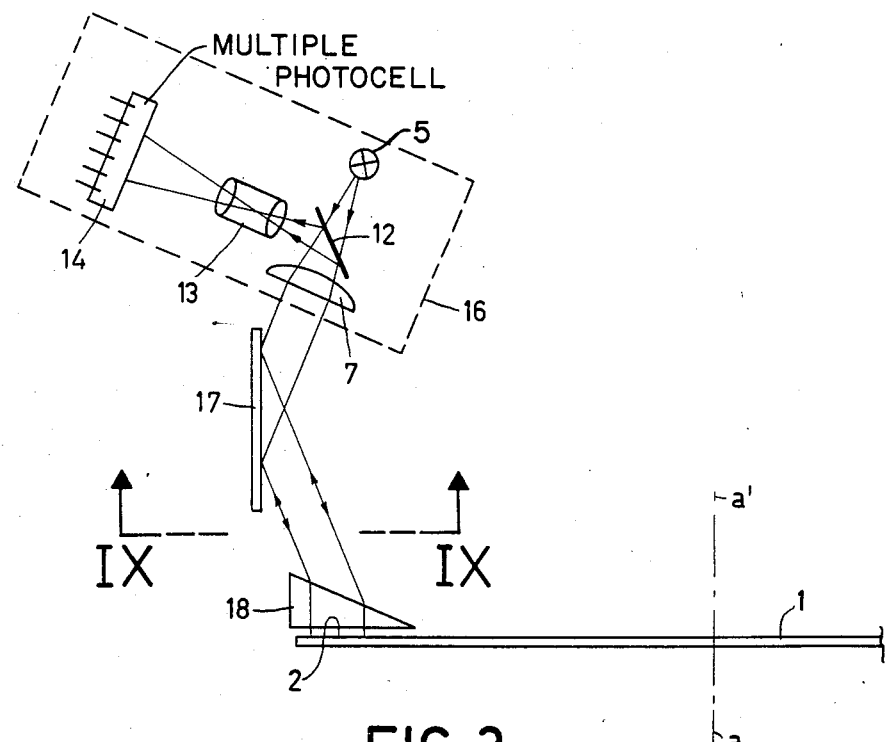
FIGS. 3, 4, 5 and 6 are side views of other embodiments of the invention.
Figure 9:
FIG. 9 is a view of the cylindrical reflector of FIG. 3 in the direction IX—IX.
Figure 8B:
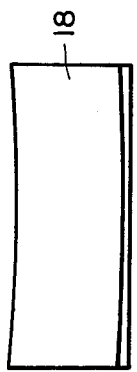
Figure 7A:
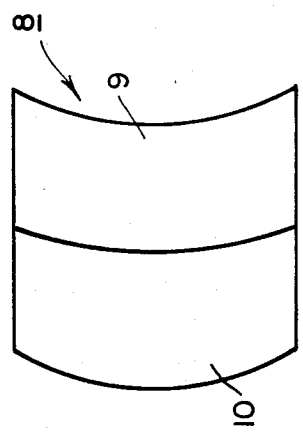
FIGS. 7a and 7b are a plan view and a side view respectively, on an enlarged scale, of the integrated conical and cylindrical element of FIGS. 1a and 1b, FIGS. 8a and 8b are elevations, on an enlarged scale, of the conical lens of FIG. 3.
Figure 7B:
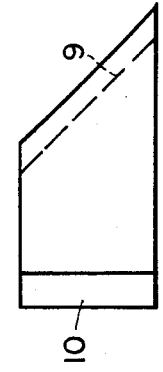
Figure 8A:
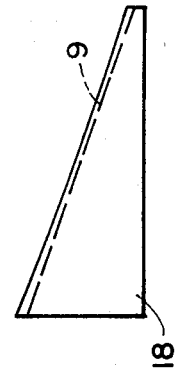

FIG. 3 shows another embodiment of the invention employing a reflecting and a refracting straight-line-generatrix element. The beam emitted by the source 5 is incident on a convave cylindrical mirror 17, whose generatrix is parallel to the axis aa' of the disk 1. FIG. 9 shows the general shape of the mirror, viewed along it axis. The rays reflected by the mirror 17 are situated in planes through the axis aa'. The element 18 is a refractive cone whose axis coincides with the axis aa'. FIG. 8a is an enlarged view of part of FIG. 3, showing the relationship of the conical surface more clearly, while FIG. 8b is a view from the direction of the axis a-a'. The cone 18 ensures that all rays are perpendicularly incident on the disk 1 and are disposed along lines having the same directions as the strips (3,4) of the measurement grating (2).

FIG. 4 is a side view of an embodiment of an apparatus in which the two straight-line-generatrix surfaces are reflecting surfaces. In this embodiment 17 is a cylindrical mirror whose generatrix is parallel to the axis aa' of the disk 1. The cylindrical mirror ensures that the incident rays are directed towards the axis aa', in the same way as the cylindrical lens 10 in FIGS. 1a and 1b. The conical surface 9 performs the same function as the surface 9 in FIGS. 1a and 1b.

Instead of a reflecting measurement grating it is alternatively possible to employ a radiation-transmitting measurement grating. FIG. 5 shows an embodiment of the invention comprising such a grating. The radiation source 5 and the field lens 7 are arranged on one side of the disk 1, for example the lower side, and the reflecting conical surface 9, the cylindrical lens 10, a second field lens 30, the objective 13 and the detection system (31, 32, 33) are arranged on the other side.

Instead of the illumination through the field lens 7 used in the apparatus shown in FIG. 5, it is possible to employ diffuse illumination using a diffuser plate at the location of the field lens.

Figure 6:
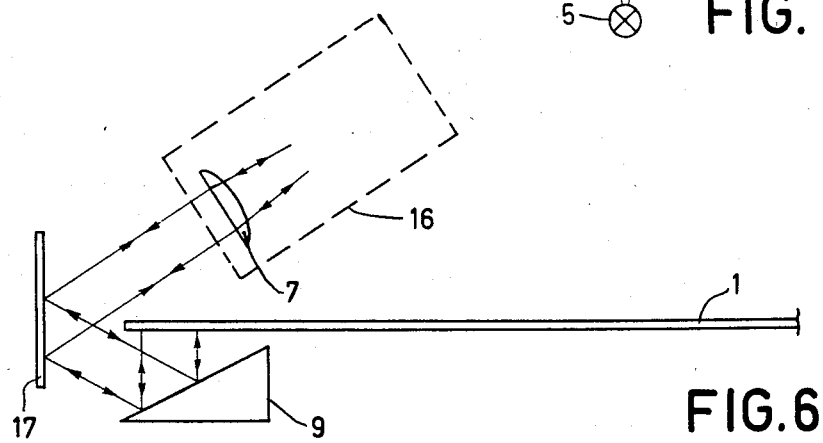
Figure 10A:
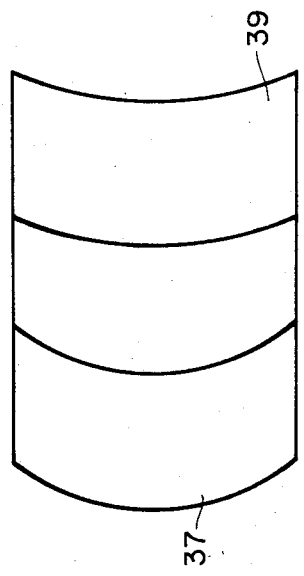
FIGS. 10a and 10b are a plan and side view respectively of an integrated element having reflecting surfaces, one conical and one cylindrical.
Figure 10B:
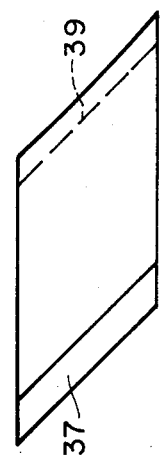

FIG. 6 shows a further embodiment of the invention employing two reflecting straight-line-generatrix surfaces. The functions of the cylindrical mirror 17 and the conical reflector 9 are the same as those of the corresponding elements in FIG. 4. These can also be combined into one element 38, having cylindrical surface 37 and conical surface 39, shown in FIGS. 10a and 10b.

In order to obtain a signal which is highly independent of lateral displacements of the object and the disk, without having to impose stringent requirements on the bearing arrangement of the disk, it is possible to employ two angular transducer systems as shown in FIGS. 1, 3, 4, 5 or 6. The transducer systems are arranged diametrically opposite each other and the signals supplied by the two multiple photo-cells are combined to form one signal.

As an alternative to the embodiments comprising a radiation-reflecting and a radiation-refracting straight-line-generatrix surface as described in the foregoing and in the embodiments comprising two radiation-reflecting straight-line-generatrix surfaces, it is possible to employ an embodiment comprising two radiation-refracting straight-line-generatrix surfaces. The surfaces may be formed by, for example, a cylindrical lens and a cone.

The straight-line-generatrix surfaces mentioned in the foregong are surfaces which in the ideal case are pure straight-line-generatrix surfaces. However, for carrying out the invention it is alternatively possible to use reflecting or refracting surfaces whose shapes depart slightly from those of ideal staight-line-generatrix surfaces.

What is claimed is:

1. An apparatus for determining the angular displacement of an object, comprising a measurement grating, means for mechanically connecting said grating to the object, and a radiation-sensitive detection system comprising a grating-like element,
characterized in thatthe measurement grating comprises radially extending grating strips on a circular disk, and
the apparatus includes an optical system comprising two straight-line-generatrix surfaces is arranged between the measurement grating and the radiation-sensitive detection system.

2. An apparatus as claimed in claim 1, characterized in that the two straight-line-generatrix surfaces comprise a radiation-refracting surface and a radiation-reflecting surface.

3. An apparatus as claimed in claim 2, characterized in that the radiation-refracting surface is a cylindrical lens and the radiation-reflecting surface is a conical reflector.

4. An apparatus as claimed in claim 1, characterized in that the two straight-line-generatrix surfaces are constituted, by radiation-reflecting surfaces.

5. An apparatus as claimed in claim 4, characterized in that one of the straight-line-generatrix surfaces is a cylindrical mirror and the other surface straight-line-generatrix a conical reflector.

6. An apparatus as claimed in claim 5, characterized in that the radiation-sensitive detection system comprises a multiple photo-cell formed by an array of line-shaped photo-diodes which are sequentially connected to an electronic circuit via an electrical switch, and said electronic circuit processes the signal generated by the photo-diodes so that a travelling grating is simulated.

7. An apparatus as claimed in claim 6, characterized in that the two straight-line-generatrix surfaces form one constructional unit.

8. An apparatus as claimed in claim 4, characterized in that the radiation-sensitive detection system comprises a multiple photo-cell formed by an array of line-shaped photo-diodes which are sequentially connected to an electronic circuit via an electrical switch, and said electronic circuit processes the signal generated by the photo-diodes so that a travelling grating is simulated.

9. An apparatus as claimed in claim 8, characterized in that the two straight-line-generatrix surfaces form one constructional unit.

10. An apparatus as claimed in claim 3, characterized in that the radiation-sensitive detection system comprises a multiple photo-cell formed by an array of line-shaped photo-diodes which are sequentially connected to an electronic circuit via an electrical switch, and said electronic circuit processes the signal generated by the photo-diodes so that a travelling grating is simulated.

11. An apparatus as claimed in claim 10, characterized in that the two straight-line-generatrix surfaces form one constructional unit.

12. An apparatus as claimed in claim 2, characterized in that the radiation-sensitive detection system comprises a multiple photo-cell formed by an array of line-shaped photo-diodes which are sequentially connected to an electronic circuit via an electrical switch, and said electronic circuit processes the signal generated by the photo-diodes so that a travelling grating is simulated.

13. An apparatus as claimed in claim 12, characterized in that the two straight-line-generatrix surfaces form one constructional unit.

14. An apparatus as claimed in claim 1, characterized in that the radiation-sensitive detection system comprises a multiple photo-cell formed by an array of line-shaped photo-diodes which are sequentially connected to an electronic circuit via an electrical switch, and said electronic circuit processes the signal generated by the photo-diodes so that a travelling grating is simulated.

15. An apparatus as claimed in claim 14, characterized in that the two straight-line-generatrix surfaces form one constructional unit.

* * * * *

UNITED STATES PATENT AND TRADEMARK OFFICE
CERTIFICATE OF CORRECTION

PATENT NO.    : 4,577,101

DATED         : March 18, 1986

INVENTOR(S)   : JOANNES G. BREMER ET AL

It is certified that error appears in the above-identified patent and that said Letters Patent is hereby corrected as shown below:

IN THE CLAIMS

Claim 1, line 6     change "thatthe" to --that the--

Claim 4, line 3     delete ","

Claim 5, lines 3-4  change "surface straight-line-generatrix" to --straight-line-generatrix surface is--

Signed and Sealed this

Twenty-eighth Day of February, 1989

Attest:

DONALD J. QUIGG

*Attesting Officer*    Commissioner of Patents and Trademarks